(12) United States Patent
Chang et al.

(10) Patent No.: US 9,142,583 B2
(45) Date of Patent: Sep. 22, 2015

(54) LIGHT SENSOR

(71) Applicant: Maxchip Electronics Corp., Hsinchu (TW)

(72) Inventors: Jin-Wei Chang, Taoyuan County (TW); Hung-Lung Wang, Taoyuan County (TW); Jung-Kai Hung, Tainan (TW); Wei-Chi Su, Tainan (TW)

(73) Assignee: Maxchip Electronics Corp., Hsinchu (TW)

( * ) Notice: Subject to any disclaimer, the term of this patent is extended or adjusted under 35 U.S.C. 154(b) by 0 days.

(21) Appl. No.: 14/089,769

(22) Filed: Nov. 26, 2013

(65) Prior Publication Data

US 2015/0091123 A1    Apr. 2, 2015

(30) Foreign Application Priority Data

Sep. 27, 2013  (TW) .............................. 102135023 A (51) Int. Cl.
*H01L 27/146* (2006.01)
*H01L 27/144* (2006.01)

(52) U.S. Cl.
CPC ........ *H01L 27/1463* (2013.01); *H01L 27/1443* (2013.01); *H01L 27/14621* (2013.01); *H01L 27/14625* (2013.01); *H01L 27/14647* (2013.01); *H01L 27/14652* (2013.01)

(58) Field of Classification Search
CPC ..................... H01L 27/1469; H01L 27/14647; G01J 1/4228
USPC ......................................................... 257/448
See application file for complete search history.

(56) References Cited

U.S. PATENT DOCUMENTS

| | | | | |
|---|---|---|---|---|
| 5,578,837 | A  * | 11/1996 | Jackson et al. | 257/53 |
| 6,300,612 | B1 * | 10/2001 | Yu | 250/208.1 |
| 2001/0013898 | A1 * | 8/2001 | Bawolek et al. | 348/272 |
| 2011/0108728 | A1 * | 5/2011 | Chang et al. | 250/338.4 |

* cited by examiner

*Primary Examiner* — Thao X Le
*Assistant Examiner* — Laura Dykes
(74) *Attorney, Agent, or Firm* — Jianq Chyun IP Office (57) ABSTRACT

Provided is a light sensor including a substrate, a dielectric layer, a plurality of pixels, a plurality of spacers, and a plurality of metal interconnects. The dielectric layer is located on the substrate. The pixels are located in the dielectric layer. The spacers are located on the sidewall of openings between adjacent pixels. The metal interconnects are located in the openings and cover the spacers so as to be electrically connected to the corresponding pixels.

20 Claims, 6 Drawing Sheets

LIGHT SENSOR

CROSS-REFERENCE TO RELATED APPLICATION

This application claims the priority benefit of Taiwan application serial no. 102135023, filed on Sep. 27, 2013. The entirety of the above-mentioned patent application is hereby incorporated by reference herein and made a part of this specification.

BACKGROUND OF THE INVENTION

1. Field of the Invention

The invention relates to a sensor. More particularly, the invention relates to a light sensor.

2. Description of Related Art

In recent years, sensing devices have been playing important roles in most industrial applications and automated control uses. Sensing devices usually include temperature sensors, humidity sensors, pressure sensors, magnetic sensors, illumination sensors, distance sensors, light sensors, and the like. Among these, light sensors have been extensively applied in various consumer products with the popularization of liquid crystal display panels and various mobile devices (such as mobile phones, personal digital assistants (PDAs), global positioning systems (GPSs), notebooks, netbooks, and so on).

Generally, light sensors contain pixels arranged in a matrix. In particular, increasing pixel density leads to shorter distance between pixels. As a result, the distance between two lower electrodes of two adjacent pixels is decreased, thus readily causing leakage current between the pixels when a voltage difference exists between the lower electrodes. If the distance between adjacent lower electrodes is increased, then the electric field in the middle region of the pixels becomes too weak. As a result, the photoelectron produced cannot readily reach the lower electrodes, thus generating a lag phenomenon. Moreover, light can also readily enter between pixels and cause crosstalk phenomenon between the pixels.

SUMMARY OF THE INVENTION

The invention provides a light sensor. The light sensor can prevent the issue of leakage and can allow the electric field of lower electrodes to be uniform to prevent lag phenomenon.

The invention provides a light sensor. The light sensor can prevent crosstalk phenomenon between pixels.

The invention provides a multi-wave band light sensor. A plurality of the multi-wave band light sensors is integrated on the same chip.

The invention provides a multi-wave band light sensor. The multi-wave band light sensor has a relatively high quantum efficiency (QE) in the visible light band and is suitable for the needs of a multi-wave band light sensor for sensing wave bands.

The invention provides a fabrication method of a multi-wave band light sensor. The fabrication method of a multi-wave band light sensor has a simple process.

The invention provides a light sensor. The light sensor includes a substrate, a dielectric layer, a plurality of pixels, a plurality of spacers, and a plurality of metal interconnects. The dielectric layer is located on the substrate. The pixels are located in the dielectric layer. Each of the spacers is located on a sidewall of the opening between the corresponding pixels. Each of the metal interconnects is located in the corresponding opening and covers the corresponding spacers so as to be electrically connected to the corresponding pixel.

The invention provides a multi-wave band light sensor. A dielectric layer is located on a substrate. A plurality of first wave band light sensors is located on the dielectric layer, wherein a first opening is located between any two adjacent first wave band light sensors. A plurality of first spacers is respectively located on sidewalls of the first openings. A plurality of first metal interconnects is respectively located in the first openings and is respectively electrically connected to the first wave band light sensors. A plurality of second wave band light sensors located in the dielectric layer, wherein a second opening is located between any two adjacent second wave band light sensors, and each of the first wave band light sensors and each of the second wave band light sensors include a lower electrode, a hydrogenated amorphous silicon layer, and a transparent upper electrode. The hydrogenated amorphous silicon layer covers the corresponding lower electrode. The transparent upper electrode covers the corresponding hydrogenated amorphous silicon layer. A plurality of second spacers is respectively located on sidewalls of the second openings. A plurality of second metal interconnects is respectively located in the second openings and is respectively electrically connected to the second wave band light sensors. A plurality of third wave band light sensors is located in the substrate, wherein at least a portion of each of the second wave band light sensors is located between the corresponding third wave band light sensors and the corresponding first wave band light sensors and is overlapped with the corresponding third wave band light sensors and the corresponding first wave band light sensors. A protective layer is located on the first wave band light sensors.

The invention provides a light sensor. The sidewall of each of the pixels of the light sensor is covered by a spacer, and the lower electrodes of adjacent pixels can be isolated to prevent the issue of leakage. Moreover, the area of each of the lower electrodes can be made larger such that electric field is uniform and the lag phenomenon does not occur.

The invention provides a light sensor. The light sensor can prevent crosstalk phenomenon between pixels.

The multi-wave band light sensor of the invention can sense the light source of a plurality of wave bands.

A plurality of the multi-wave band light sensors of the invention is integrated on the same chip.

The multi-wave band light sensor of the invention has a relatively high QE in the visible light band and is suitable for the needs of a multi-wave band light sensor for sensing.

The fabrication method of a multi-wave band light sensor of the invention has a simple process.

The fabrication method of a multi-wave band light sensor of the invention can reduce layout area and can lower the budget of the manufacturing process of the filter, and thereby reduce the costs of materials and the overall process.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
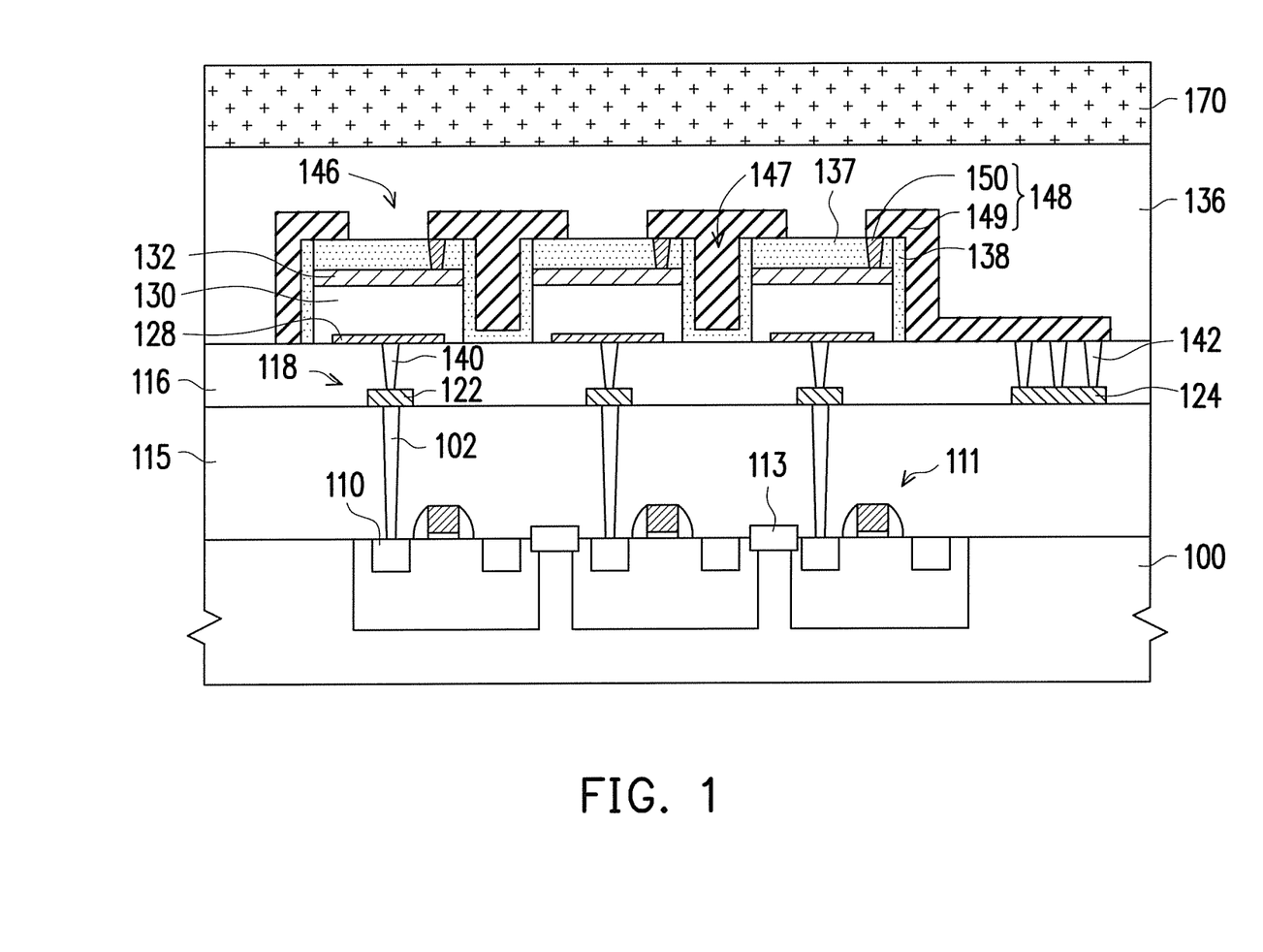
FIG. 1 is a schematic cross-sectional diagram of a light sensor illustrated according to an embodiment of the invention.

FIG. 1 is a schematic cross-sectional diagram of a light sensor illustrated according to an embodiment of the invention.

Referring to FIG. 1, a substrate 100 is provided. The material of the substrate 100 is, for instance, a doped semiconductor such as a P-type silicon substrate, an N-type silicon substrate, or an undoped silicon substrate. A plurality of isolation structures 113 is formed in the substrate 100. Each of the isolation structures 113 can reduce noise interference. Each of the isolation structures 113 is, for instance, a shallow trench isolation structure. Then, metal-oxide semiconductor devices 111 such as N-channel field effect transistors (NMOSs), P-channel field effect transistors (PMOSs), or complementary field effect transistors (CMOSs) are formed on the substrate 100.

Afterward, dielectric layers 115 and 116 and metal interconnects 118 are formed on the substrate 100. The material of each of the dielectric layers 115 and 116 is, for instance, silicon oxide, borophosphosilicate glass (BPSG), phosphosilicate glass (PSG), undoped silicate glass (USG), fluorosilicate glass (FSG), spin-on glass (SOG), or a low dielectric constant material with a dielectric constant lower than 4. The forming method of each of the dielectric layers 115 and 116 can be chemical vapor deposition (CVD) or a spin coating method.

Each of the metal interconnects 118 is electrically connected to a source region 110 of the corresponding metal-oxide semiconductor devices 111. Each of the metal interconnects 118 includes a contact 102, a metal layer 122, and a via 140. In FIG. 1, only the contact 102 is illustrated between the metal layer 122 of the corresponding metal interconnect 118 and the corresponding metal-oxide semiconductor device 111. However, the invention is not limited thereto. The metal layers 122 can be top metal layers and can also be any metal layers in the metal interconnects 118. Moreover, a plurality of metal layers and a plurality of vias can be disposed between the metal layers 122 and the contacts 102.

The forming method of the metal interconnects 118 can include forming the contacts 102 in the dielectric layer 115, and then forming the metal layers 122 on the dielectric layer 115. In an embodiment, when forming the metal layers 122 of the metal interconnects 118, a plurality of pads 124 is formed at the same time. In another embodiment, the height of each of the pads 124 can be different than the height of each of the metal layers 122 (not shown). Then, the dielectric layer 116 is formed on the substrate 100. The material of the dielectric layer 116 is, for instance, silicon oxide, BPSG, PSG, USG, FSG, SOG, or a low dielectric constant material with a dielectric constant lower than 4. The forming method of the dielectric layer 116 can be CVD or a spin coating method. Next, a plurality of vias 140 and 142 are formed in the dielectric layer 116.

Then, a plurality of pixels (also referred to as light sensors) 146 is formed on the dielectric layer 116. Each of the pixels 146 can be a red pixel, a green pixel, or a blue pixel. The pixels 146 can respectively include, from the bottom up, a lower electrode 128, a hydrogenated amorphous silicon layer 130, and a transparent upper electrode 132. The lower electrodes 128 are respectively electrically connected to the vias 140 of the metal interconnects 118. The hydrogenated amorphous silicon layers 130 are respectively located between the lower electrodes 128 and the transparent upper electrodes 132 and cover the surfaces of the lower electrodes 128, and are respectively extended to cover the sidewalls of the lower electrodes 128. In an embodiment, each of the hydrogenated amorphous silicon layers 130 is a stacked structure. Each of the stacked structure is, for instance, a PIN structure. Specifically, each of the stacked structure includes a hydrogenated amorphous silicon layer of a first conductivity type, an intrinsic hydrogenated amorphous silicon layer, and a hydrogenated amorphous silicon layer of a second conductivity type. Each of the hydrogenated amorphous silicon layers of the first conductivity type is N-type, and the N-type dopant is, for instance, phosphorous or arsenic. Each of the hydrogenated amorphous silicon layers of the second conductivity type is P-type, and the P-type dopant is, for instance, boron.

In the embodiments of the invention, cap layers 137 cover the transparent upper electrodes 132 of the corresponding pixels 146, and spacers 138 are formed on the sidewalls of openings 147 located between any two adjacent pixels 146. The spacers 138 can be optionally extended to the bottom of the openings 147.

In one embodiment, the pixels 146, the cap layers 137, and the spacers 138 are formed by the following steps. The lower electrodes 128 are formed on the dielectric layer 116 such that the lower electrodes 128 are electrically connected to the vias 140. The material of the lower electrodes 128 includes a metal such as titanium nitride (TiN), tungsten (W), chromium (Cr), or aluminum (Al), and the forming method of the lower electrodes 128 includes, for instance, depositing a lower electrode material layer using physical vapor deposition (PVD) or CVD, and then patterning with a lithography process and an etching process. When the lower electrodes 128 are a metal, the thickness of each thereof is very thin, such as 50 angstroms to 500 angstroms, such that light can pass through.

Then, the hydrogenated amorphous silicon layers 130, the transparent upper electrodes 132, and the cap layers 137 are formed on the lower electrodes 128. The forming method of each of the hydrogenated amorphous silicon layers 130, the transparent upper electrodes 132, and the cap layers 137 includes, for instance, forming a hydrogenated amorphous silicon material layer, a transparent upper electrode material layer, and a cap material layer, and then performing a lithography process and an etching process to form the hydrogenated amorphous silicon layers 130, the transparent upper electrodes 132, and the cap layers 137.

In an embodiment, each of the hydrogenated amorphous silicon layers 130 is a stacked structure. Each of the stacked structure sequentially includes a hydrogenated amorphous silicon layer of the first conductivity type, an intrinsic hydrogenated amorphous silicon layer, and a hydrogenated amorphous silicon layer of the second conductivity type. Plasma enhanced CVD can be used for the deposition method of the hydrogenated amorphous silicon layers with $B_2H_6/H_2$ and $PH_3/H_2$ as reactive dopant gases. Moreover, the type or the concentration of the doping process and the parameter of the deposition process are changed during the deposition procedure to form the hydrogenated amorphous silicon layers. More specifically, each of the hydrogenated amorphous silicon layers of the second conductivity type is P-type, the thickness thereof is, for instance, about 50 angstroms to about 500 angstroms, the concentration of the P-type dopant is, for instance, about $1 \times 10^{19}$ to about $1 \times 10^{22}$ atoms/cm$^3$, and the P-type dopant is, for instance, boron. The thickness of each of the intrinsic hydrogenated amorphous silicon layers is, for instance, about 500 angstroms to about 5,000 angstroms. Each of the hydrogenated amorphous silicon layers of the first conductivity type is N-type, the thickness thereof is, for instance, about 50 angstroms to about 500 angstroms, the concentration of the N-type dopant is, for instance, about $1\times10^{19}$ to about $1\times10^{22}$ atoms/cm$^3$, and the N-type dopant is, for instance, phosphorous or arsenic.

The material used to form each of the transparent upper electrodes 132 includes a transparent conductive oxide such as indium tin oxide, and the deposition method is, for instance, a sputtering method. The thickness of each of the transparent upper electrodes 132 is, for instance, about 500 to about 5,000 angstroms. The cap material layer used to form the cap layers 137 can be an insulating material such as silicon oxide or silicon oxynitride, the forming method is, for instance, chemical vapor deposition, and the thickness is, for instance, about 500 angstroms to about 5,000 angstroms.

Afterward, spacers 138 are formed on the sidewalls of the pixels 146. The spacers 138 can be an insulating material such as silicon oxide, silicon oxynitride, or silicon nitride. The forming method of the spacers 138 can include forming a spacer material layer and then performing an anisotropic etching process to form the spacers 138 on the sidewalls of the pixels 146 (or the sidewalls of the openings 147). In an embodiment, the spacers 138 are not only located on the sidewalls of the pixels 146, but are also extended to the bottom of the openings 147.

Then, a plurality of metal interconnects 148 are formed to electrically connect the transparent upper electrodes 132 of any two adjacent pixels 146. More specifically, each of the metal interconnects 148 includes a metal layer 149 and a via 150. Each of the metal layers 149 is located between the spacers 138 in the corresponding opening 147 and is extended to cover a portion of the corresponding cap layer 137. Each of the vias 150 passes through the corresponding cap layer 137 and electrically connects the corresponding metal layer 149 and the corresponding transparent upper electrode 132 adjacent to the metal layer 149. The forming method of the metal interconnects 148 can include forming the via 150 in the corresponding cap layer 137 and then forming the metal layer 149. The material of the vias 150 can be a metal such as tungsten, aluminum, or copper. The forming method of the vias 150 can include, for instance, forming a via opening in the corresponding cap layer 137. Then, a metal is filled into the via opening. Each of the metal layer 149 includes a metal material layer such as Al, TiN, or W. Then, a lithography process and an etching process are performed to pattern the metal material layer. The transparent upper electrode 132 of each of the pixels 146 can be connected to the corresponding pad 124 through the corresponding via 142 and the corresponding via 150.

Then, a protective layer 136 is formed on the substrate 100 to cover the pixels 146 and the metal layers 149. The material of the protective layer 136 is, for instance, polyimide (PI). Next, a filter 170 is formed on the protective layer 136. The filter 170 is, for instance, an infrared filter. The infrared filter can filter out light of an infrared wave band and allow a wavelength other than the infrared wave band to pass through, such as allowing a wavelength shorter than a specific wavelength to pass through. In particular, the range of the specific wavelength is, for instance, 760 nm to 1,000 nm.

Subsequent process includes cutting the substrate and packaging . . . etc. which are not described.

Referring to FIG. 1, in the embodiments of the invention, each of the pixels 146 can include, from the bottom up, a lower electrode 128, a hydrogenated amorphous silicon layer 130, and a transparent upper electrode 132. Each of the lower electrodes 128 is electrically connected to the corresponding source region 110 of the corresponding metal-oxide semiconductor device 111 through the corresponding via 140 of the corresponding metal interconnect 118. Each of the hydrogenated amorphous silicon layers 130 is located between the corresponding lower electrode 128 and the corresponding transparent upper electrode 132. Each of the hydrogenated amorphous silicon layers 130 covers the surface of the corresponding lower electrode 128 and is extended to cover the sidewalls of the corresponding lower electrode 128. In an embodiment, each of the hydrogenated amorphous silicon layers 130 is a stacked structure. Each of the stacked structure includes, from the bottom up, a hydrogenated amorphous silicon layer of the first conductivity type, an intrinsic hydrogenated amorphous silicon layer, and a hydrogenated amorphous silicon layer of the second conductivity type. Each of the hydrogenated amorphous silicon layers of the second conductivity type is P-type and each of the hydrogenated amorphous silicon layers of the first conductivity type is N-type. Each of the transparent upper electrodes 132 covers the corresponding hydrogenated amorphous silicon layer 130.

Moreover, in the embodiments of the invention, the transparent upper electrode 132 of each of the pixels 146 is covered by the corresponding cap layer 137 and the sidewalls of each of the pixels 146 are covered by the corresponding spacers 138. Each of the metal interconnects 148 is located in the corresponding opening 147 between any two adjacent pixels 146. Each of the metal interconnects 148 is electrically isolated from the sidewalls of the corresponding pixels 146 through the corresponding spacers 138. However, Each of the vias 150 of the corresponding metal interconnect 148 passes through the corresponding cap layer 137 and is electrically connected to the corresponding transparent upper electrode 132. Each of the lower electrodes 128 of any two adjacent pixels 146 can be isolated by the corresponding spacers 138 to prevent the issue of leakage. Moreover, the area of each of the lower electrodes 128 can be made larger such that electric field is uniform to prevent the occurrence of a lag phenomenon.

Moreover, each of the metal interconnects 149 is disposed between any two adjacent pixels 146 and completely fills the corresponding opening 147 such that light does not readily enter regions outside of the corresponding pixel 146. As a result, crosstalk can be avoided.

Figure 2A:
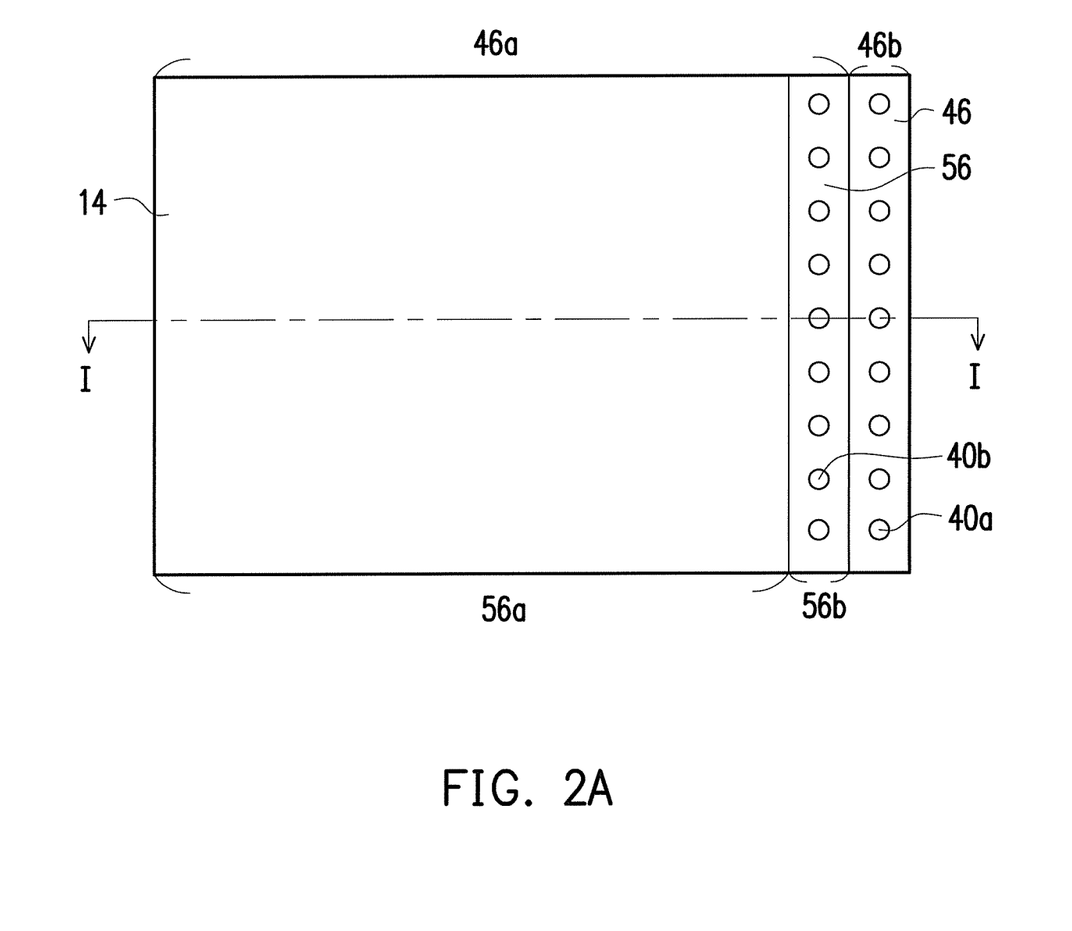
FIG. 2A is a top view of a portion of a multi-wave band light sensor illustrated according to an embodiment of the invention.
Figure 2B:
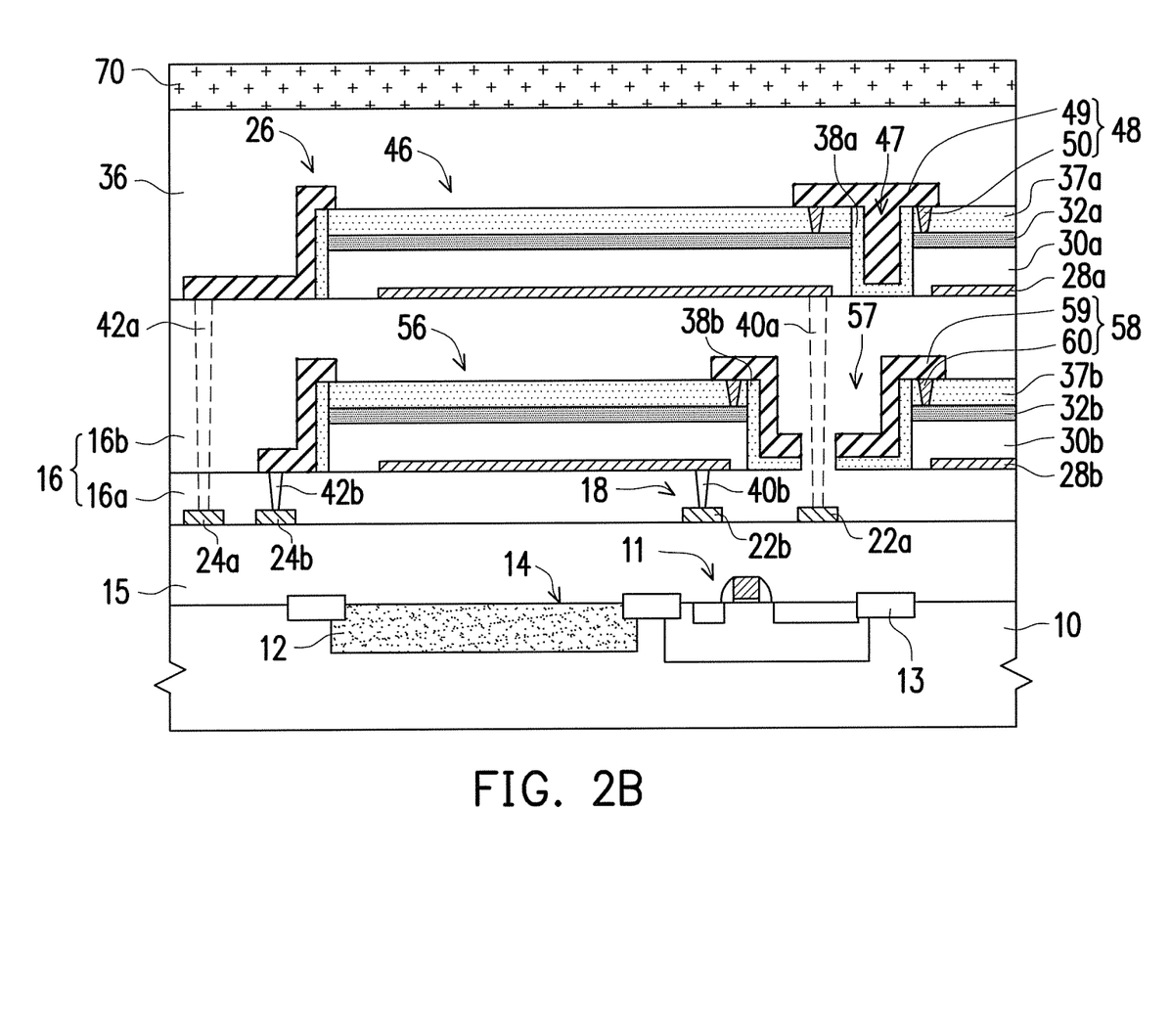
FIG. 2B illustrates a partial schematic cross-sectional diagram of the multi-wave band light sensor of FIG. 2A at the cutting-plane line I-I.

FIG. 2A is a top view of a portion of a multi-wave band light sensor illustrated according to an embodiment of the invention. FIG. 2B illustrates a partial cross-sectional schematic diagram of the multi-wave band light sensor of FIG. 2A at the cutting-plane line I-I.

Referring to FIGS. 2A and 2B, a substrate 10 is provided. The material of the substrate 10 is, for instance, a doped semiconductor such as a P-type silicon substrate, an N-type silicon substrate, or an undoped silicon substrate. A plurality of isolation structures 13 is formed in the substrate 10. Each of the isolation structures 13 can reduce noise interference. Each of the isolation structures 13 is, for instance, a shallow trench isolation structure. Then, a plurality of third wave band light sensors 14 such as red light sensing structures of a multi-wave band light sensing structure 26 is formed in the substrate 10. Each of the red light sensing structure is, for instance, a junction diode, and the forming method of the junction diodes includes forming a well region 12 in the substrate 10. In particular, each of the well regions 12 is in contact with the substrate 10 and the conductivity type of each of the well regions 12 is different than the conductivity type of the substrate 10. In an embodiment, the substrate 10 is a P-type silicon substrate and each of the well regions 12 is an N-type doped region. The forming method of the well regions 12 includes, for instance, forming a mask layer on the substrate 10, then performing an ion implantation process to implant a dopant into the substrate 10 to form the well regions 12, and then removing the mask layer. The P-type dopant implanted in the ion implantation process is, for instance, boron, and the N-type dopant is, for instance, phosphorous or arsenic. In an embodiment, in addition to forming the third wave band light sensors 14, a metal-oxide semiconductor device 11 such as an NMOS, a PMOS, or a CMOS is also formed on the substrate 10. The material of the dielectric layer 15 is, for instance, silicon oxide, BPSG, PSG, USG, FSG, SOG, or a low dielectric constant material with a dielectric constant lower than 4. The forming method of the dielectric layer 15 can be CVD or a spin coating method.

Then, referring to FIGS. 2A and 2B, a plurality of metal interconnects 18 is formed in the dielectric layer 15 and on the dielectric layer 15 on the substrate 10. Each of the metal interconnects 18 includes metal layers 22a and 22b. In an embodiment, when forming the metal layers 22a and 22b of the metal interconnects 18, pads 24a and 24b are formed at the same time. In another embodiment, the height of each of the pads 24a and 24b can be different than the height of each of the metal layers 22a and 22b (not shown).

Then, referring to FIGS. 2A and 2B, a dielectric layer 16a is formed on the substrate 10. The material of the dielectric layer 16a is, for instance, silicon oxide, BPSG, PSG, USG, FSG, SOG, or a low dielectric constant material with a dielectric constant lower than 4. The forming method of the dielectric layer 16a can be CVD or a spin coating method.

Then, referring to FIGS. 2A and 2B, a dielectric layer 16b, as well as a plurality of first wave band light sensor 46 and a plurality of second wave band light sensor 56 of the multi-wave band light sensor 26, are formed on the dielectric layer 16a. The first wave band light sensors 46 and the second wave band light sensors 56 are located above the third wave band light sensors 14. The second wave band light sensors 56 are located between the first wave band light sensors 46 and the third wave band light sensors 14. In an embodiment, the first wave band light sensors 46, the second wave band light sensors 56, and the third wave band light sensors 14 can sense the visible spectrum in the wavelength of about 400 nm to about 750 nm. In particular, each of the first wave band light sensors 46 includes a blue light sensor, and the range of sensible spectral peaks is in the wavelength of, for instance, about 450 nm to about 480 nm; each of the second wave band light sensors 56 includes a green light sensor, and the range of sensible spectral peaks is in the wavelength of, for instance, about 490 nm to about 550 nm; and each of the third wave band light sensors 14 includes a red light sensor, and the range of sensible spectral peaks is in the wavelength of, for instance, about 600 nm to about 700 nm.

Referring to FIGS. 2A and 2B, the first wave band light sensors 46 are located on the dielectric layer 16b above the second wave band light sensors 56 and completely cover the second wave band light sensors 56 and the third wave band light sensors 14. A portion 46a of each of the first wave band light sensors 46 is overlapped with the second wave band light sensor 56 therebelow, another portion 46b of each of the first wave band light sensors 46 is not overlapped with the corresponding second wave band light sensor 56 and is extended beyond the corresponding second wave band light sensor 56 along a first direction (such as the x direction). The other portion 46b of each of the first wave band light sensors 46 is electrically connected to the metal layer 22a of the corresponding metal interconnect 18 through a via 40a.

Referring to FIGS. 2A and 2B, the second wave band light sensors 56 are located above the dielectric layer 16a and covered by the dielectric layer 16b. The second wave band light sensors 56 are located between the first wave band light sensors 46 and the third wave band light sensors 14 and at least a portion of each of the second wave band light sensors 56 is overlapped with the corresponding first wave band light sensor 46 and the corresponding third wave band light sensor 14. The area of each of the second wave band light sensors 56 is less than the area of each of the first wave band light sensors 46 and is greater than the area of each of the third wave band light sensors 14. Moreover, the second wave band light sensors 56 completely cover the third wave band light sensors 14. A portion 56a of each of the second wave band light sensors 56 is overlapped with the third wave band light sensor 14 therebelow, another portion 56b of each of the second wave band light sensors 56 is not overlapped with the corresponding third wave band light sensor 14 and is extended along the first direction (such as the x direction). Each of the second wave band light sensors 56 is electrically connected to the metal layer 22b of the metal interconnect 18 through a via 40b.

Referring to FIG. 2B, each of the first wave band light sensors 46 and the second wave band light sensors 56 can include, from the bottom up, lower electrodes 28a and 28b, hydrogenated amorphous silicon layers 30a and 30b, and transparent upper electrodes 32a and 32b. The lower electrodes 28a and 28b are electrically connected to the vias 40a and 40b of the metal interconnect 18, respectively. The hydrogenated amorphous silicon layers 30a and 30b are respectively located between the lower electrodes 28a and 28b and the transparent upper electrodes 32a and 32b and cover the surface of each of the lower electrodes 28a and 28b, and are extended to cover the sidewalls of each of the lower electrodes 28a and 28b. In an embodiment, each of the hydrogenated amorphous silicon layers 30a and 30b is a stacked structure. Each of the stacked structures sequentially includes a hydrogenated amorphous silicon layer of the first conductivity type, an intrinsic hydrogenated amorphous silicon layer, and a hydrogenated amorphous silicon layer of the second conductivity type. The transparent upper electrodes 32a and 32b respectively cover the hydrogenated amorphous silicon layers 30a and 30b.

In the embodiments of the invention, a cap layer 37a covers the transparent upper electrode 32a of each of the first wave band light sensor 46. The sidewalls of first openings 47 between any two adjacent first wave band light sensors 46 are covered by first spacers 38a. The first spacers 38a can optionally be extended to the bottom of the first openings 47.

A plurality of first metal interconnects 48 is located in the first openings 47 and electrically connects two corresponding first wave band light sensors 46 adjacent to each other. More specifically, each of the first metal interconnects 48 includes a metal layer 49 and a via 50. Each of the metal layers 49 is located between the corresponding first spacers 38a in the corresponding first opening 47 and is extended to a portion of the corresponding cap layer 37a on the corresponding transparent upper electrode 32a of the corresponding first wave band light sensor 46. Each of the vias 50 passes through the corresponding cap layer 37a and electrically connects the corresponding metal layer 49 and the corresponding transparent upper electrode 32a adjacent to the metal layer 49.

Similarly, a cap layer 37b covers the transparent upper electrode 32b of each of the second wave band light sensors 56. The sidewalls of second openings 57 between two adjacent second wave band light sensors 56 are covered by second spacers 38b. The second spacers 38b can optionally be extended to the bottom of the second openings 57.

A plurality of second metal interconnects 58 is located in the second openings 57 and electrically connects two corresponding second wave band light sensors 56 adjacent to each other. More specifically, each of the second metal interconnects 58 includes a metal layer 59 and a via 60. Each of the metal layers 59 is located between the second spacers 38b in the corresponding second opening 57 and is extended to a portion of the corresponding cap layer 37b on the corresponding transparent upper electrode 32b. Each of the vias 60 passes through the corresponding cap layer 37b and electrically connects the corresponding metal layer 59 and the corresponding transparent upper electrode 32b adjacent to the metal layer 59.

Referring to FIG. 2B, in an embodiment, the step of forming the multi-wave band light sensor 26 includes first forming the lower electrodes 28b on the dielectric layer 16a such that each of the lower electrodes 28b is electrically connected to the corresponding via 40b. The material of the lower electrodes 28b includes a metal such as TiN, W, Cr, or Al, and the forming method of the lower electrodes 28b includes, for instance, depositing a lower electrode material layer using PVD or CVD, and then patterning with a lithography process and an etching process. When the lower electrodes 28 are metal layers, the thickness of each thereof is very thin, such as about 50 angstroms to about 500 angstroms, such that green light can pass through.

Then, referring to FIG. 2B, the hydrogenated amorphous silicon layers 30b, the transparent upper electrodes 32b, and the cap layers 37b are formed on the lower electrodes 28b. The forming method of each of the hydrogenated amorphous silicon layers 30b, the transparent upper electrodes 32b, and the cap layers 37b includes, for instance, forming a hydrogenated amorphous silicon material layer, a transparent upper electrode material layer, and a cap material layer and then performing a lithography process and an etching process to form the hydrogenated amorphous silicon layers 30b, the transparent upper electrodes 32b, and the cap layers 37b.

In an embodiment, the hydrogenated amorphous silicon material layer used to form the hydrogenated amorphous silicon layers 30b is a stacked structure. The stacked structure includes, from the bottom up, a hydrogenated amorphous silicon layer of the first conductivity type, an intrinsic hydrogenated amorphous silicon layer, and a hydrogenated amorphous silicon layer of the second conductivity type. Plasma enhanced CVD can be used for the deposition method of the hydrogenated amorphous silicon layers 30b with $B_2H_6/H_2$ and $PH_3/H_2$ as reactive dopant gases. Moreover, the type or the concentration of the doping process and the parameter of the deposition process are changed during the deposition procedure to form the hydrogenated amorphous silicon layers 30b. The patterning method of the hydrogenated amorphous silicon layers 30b is, for instance, a lithography process and an etching process.

In an embodiment, each of the second wave band light sensors 56 is a green light sensor, and the stacked structure of the hydrogenated amorphous silicon layer 30b thereof has a PIN structure. More specifically, each of the hydrogenated amorphous silicon layers of the second conductivity type is P-type, the thickness thereof is, for instance, about 50 angstroms to about 500 angstroms, the concentration of the P-type dopant is, for instance, about $1\times10^{19}$ to about $1\times10^{22}$ atoms/cm$^3$, and the P-type dopant is, for instance, boron. The thickness of each of the intrinsic hydrogenated amorphous silicon layers is, for instance, about 500 angstroms to about 5,000 angstroms. Each of the hydrogenated amorphous silicon layers of the first conductivity type is N-type, the thickness thereof is, for instance, about 50 angstroms to about 500 angstroms, the concentration of the N-type dopant is, for instance, about $1\times10^{19}$ to about $1\times10^{22}$ atoms/cm$^3$, and the N-type dopant is, for instance, phosphorous or arsenic.

The material used to form the transparent upper electrode material layer of each of the transparent upper electrodes 32b includes a transparent conductive oxide such as indium tin oxide, and the deposition method is, for instance, a sputtering method. The thickness of each of the transparent upper electrodes 32b is, for instance, about 500 to about 5,000 angstroms. The cap material layer used to form the cap layers 37b can be an insulating material such as silicon oxide or silicon oxynitride, the forming method is, for instance, CVD, and the thickness is, for instance, about 500 to about 5,000 angstroms.

Then, the second spacers 38b are formed on the sidewalls of the second wave band light sensors 56. The second spacers 38b can be an insulating material such as silicon oxide, silicon oxynitride, or silicon nitride, and the foiling method thereof can include forming a second spacer material layer and then performing an anisotropic etching process to fore the second spacers 38b on the sidewalls of the second wave band light sensors 56. In an embodiment, the second spacers 38b are not only located on the sidewalls of the second wave band light sensors 56, but are also extended to the bottom of the second openings 57. The second spacers 38b can be formed by forming a second spacer material layer and then performing a lithography process and an etching process.

Then, the vias 60 are formed in the cap layers 37b and then the metal layers 59 are formed therein. The material of the vias 60 can be a metal such as tungsten, aluminum, or copper. The forming method of the vias 60 can include, for instance, first forming a via opening in the cap layers 37b, and then filling a metal into the via opening. Each of the metal layers 59 includes a metal material layer such as Al, TiN, or W. Then, a lithography process and an etching process are performed to pattern the metal material layer. The transparent upper electrode 32b of each of the second wave band light sensors 56 can be connected to the corresponding pad 24b through the corresponding via 42b and the corresponding via 60.

Then, referring to FIG. 2B, the dielectric layer 16b is formed on the second wave band light sensors 56. The dielectric layer 16b and the dielectric layer 16a form a dielectric layer 16. The material of the dielectric layer 16b can be the same or different than the material of the dielectric layer 16a. The material of the dielectric layer 16b is, for instance, silicon oxide, BPSG, PSG, USG, FSG, SOG, or a low dielectric constant material with a dielectric constant lower than 4. The forming method of the dielectric layer 16b can include CVD or a spin coating method.

Then, referring to FIG. 2B, the lower electrodes 28a, the hydrogenated amorphous silicon layers 30a, and the transparent upper electrodes 32a of the first wave band light sensors 46, as well as the cap layers 37a, the first spacers 38a, the vias 50, and the metal layers 49 of the first metal interconnects 48 are formed on the dielectric layer 16b. The transparent upper electrode 32a of each of the first wave band light sensors 46 can be connected to the corresponding pad 24a through the corresponding via 42a and the corresponding via 50. The forming method of each of the lower electrodes 28a, the transparent upper electrodes 32a, the cap layers 37a, the first spacers 38a, the vias 50, and the metal layers 49 is the same as the forming method of each of the lower electrodes 28b, the transparent upper electrodes 32b, the cap layers 37b, the second spacers 38b, the vias 60, and the metal layers 59 and is not repeated herein. The deposition method of the hydrogenated amorphous silicon layers 30a is also similar to the deposition method of the hydrogenated amorphous silicon layers 30b and is not repeated herein.

Then, referring to FIG. 2B, a protective layer 36 is formed on the substrate 10 and the protective layer 36 covers the multi-wave band light sensing structure 26. The material of the protective layer 36 is, for instance, polyimide. Next, a filter 70 is formed on the protective layer 36. The filter 70 covers the first wave band light sensors 46. The filter 70 is, for instance, an infrared filter. The infrared filter can filter out light of an infrared wave band and allow a specific wavelength other than the infrared wave band to pass through, such as allowing a wavelength shorter than a specific wavelength to pass through. In particular, the range of the specific wavelength is, for instance, about 760 nm to about 1,000 nm.

Subsequent process includes cutting the substrate and packaging . . . etc. which are not described. After cutting and packaging, multi-wave band light sensors can be formed, and the multi-wave band light sensors are integrated on the same region of the same chip for sensing the light source of different wave bands.

Referring to FIG. 2B, in the embodiments above, the multi-wave band light sensing structure 26 is disposed on the metal layers 22a and 22b of the metal interconnects 18. However, in actual application, the configuration is not limited thereto. If the process conditions allow, the multi-wave band light sensing structure 26 can also be disposed between any two metal layers of the metal interconnects 18.

Referring to FIGS. 2A and 2B, the multi-wave band light sensor of the embodiments of the invention includes a substrate 10 and a multi-wave band light sensing structure 26. The multi-wave band light sensing structure 26 includes a plurality of first wave band light sensors 46, a plurality of second wave band light sensors 56, and a plurality of third wave band light sensors 14. The third wave band light sensors 14 are located in the substrate 10 for sensing red light. The first wave band light sensors 46 and the second wave band light sensors 56 are located above the third wave band light sensors 14 for sensing and filtering light of two wave bands, such as blue light and green light.

More specifically, each of the third wave band light sensors 14 is, for instance, a junction diode formed by the substrate 10 and the corresponding well region 12 in the substrate 10 for sensing red light. The second wave band light sensors 56 are located between the first wave band light sensors 46 and the third wave band light sensors 14. Each of the first wave band light sensors 46 and the second wave band light sensors 56 can include, from the bottom up, lower electrodes 28a and 28b, hydrogenated amorphous silicon layers 30a and 30b, and transparent upper electrodes 32a and 32b. The hydrogenated amorphous silicon layers 30a and 30b are located on the lower electrodes 28a and 28b and cover the surface and the sidewalls of each of the lower electrodes 28a and 28b. The transparent upper electrodes 32a and 32b cover the hydrogenated amorphous silicon layers 30a and 30b. In an embodiment, each of the hydrogenated amorphous silicon layers 30a and 30b is a stacked structure. Each of the stacked structures includes a hydrogenated amorphous silicon layer of a first conductivity type located on the lower electrodes 28a and 28b, an intrinsic hydrogenated amorphous silicon layer located on the hydrogenated amorphous silicon layer of the first conductivity type, and a hydrogenated amorphous silicon layer of a second conductivity type located on the intrinsic hydrogenated amorphous silicon layer. In particular, the first conductivity type is N-type and the second conductivity type is P-type. In an embodiment, the lower electrodes 28a and 28b are electrically connected to the metal interconnects 18 in the dielectric layer 16 through the vias 40a and 40b.

The transparent upper electrodes 32a and 32b of the first wave band light sensors 46 and the second wave band light sensors 56 are respectively covered by the cap layers 37a and 37b. The sidewalls of each of the first wave band light sensors 46 and the second wave band light sensors 56 are covered by the first spacers 38a and the second spacers 38b. The vias 50 of the first metal interconnects 48 and the vias 60 of the second metal interconnects 58 respectively pass through the cap layers 37a and 37b and are electrically connected to the transparent upper electrodes 32a and 32b.

In an embodiment, when light passes through the filter 70, light of an infrared wave band is filtered out. When light propagates downward, light of the first wave band (such as blue light) can be sensed and filtered by the first wave band light sensors 46. When the light continues to propagate, light of the second wave band (such as green light) can be sensed by the second wave band light sensors 56. As the light continues to propagate to the third wave band light sensors 14 after being filtered twice, light of the third wave band (such as red light) can be sensed by the third wave band light sensors 14. In other words, in the invention, a single region of the substrate 10 can sense light of the first wave band (such as blue light), light of the second wave band (such as green light), and light of the third wave band (such as red light). Therefore, the area of the chip can be reduced.

Moreover, since the sidewalls of the first wave band light sensors 46/second wave band light sensors 56 are covered by the first spacers 38a/second spacers 38b, the lower electrodes 28a/28b of adjacent first wave band light sensors 46/second wave band light sensors 56 can be isolated to prevent the issue of leakage. Moreover, the area of each of the lower electrodes 28a/28b can be made larger such that electric field is uniform. As a result, lag phenomenon can be prevented. Moreover, each of the first metal interconnects 48/second metal interconnects 58 is disposed in the corresponding first opening 47/second opening 57 between two adjacent first wave band light sensors 46/second wave band light sensors 56 such that light does not readily enter regions outside of the first wave band light sensors 46/second wave band light sensors 56. As a result, crosstalk can be avoided.

Figure 3:
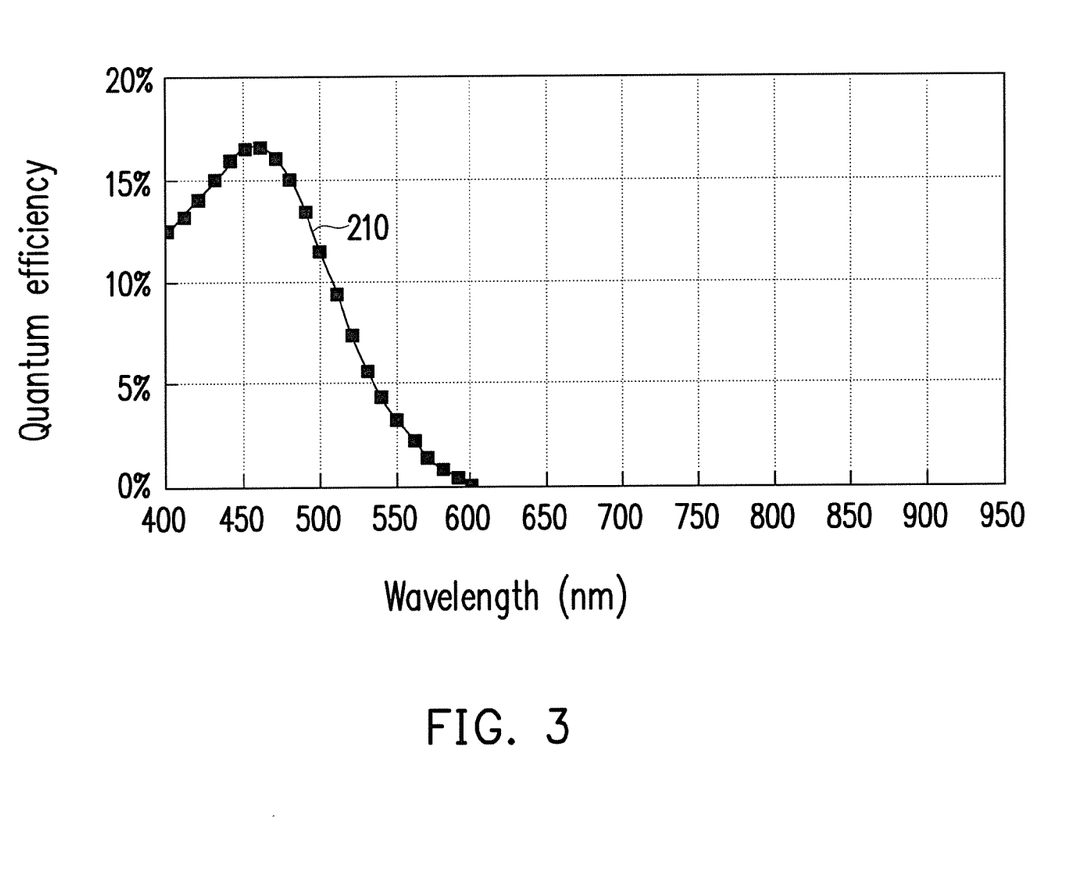
FIGS. 3-5 illustrate three quantum efficiency (QE) spectra sensed by a light sensor of different wave bands.
Figure 4:
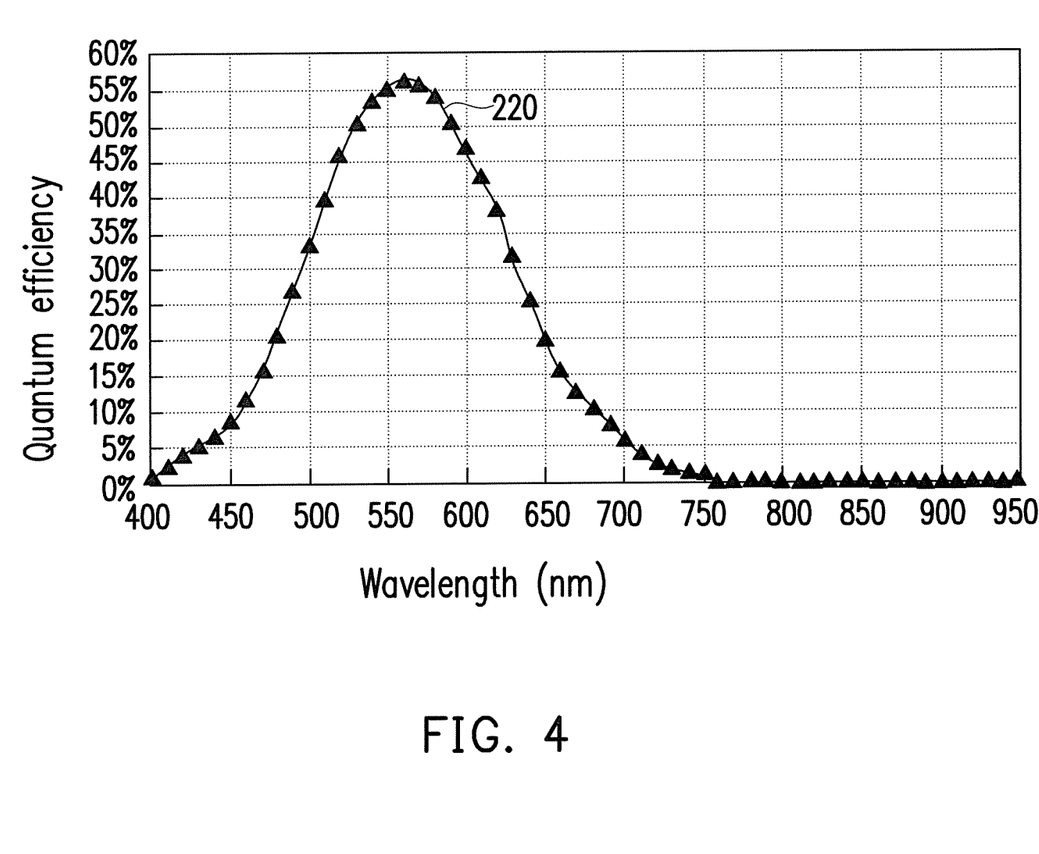
Figure 5:
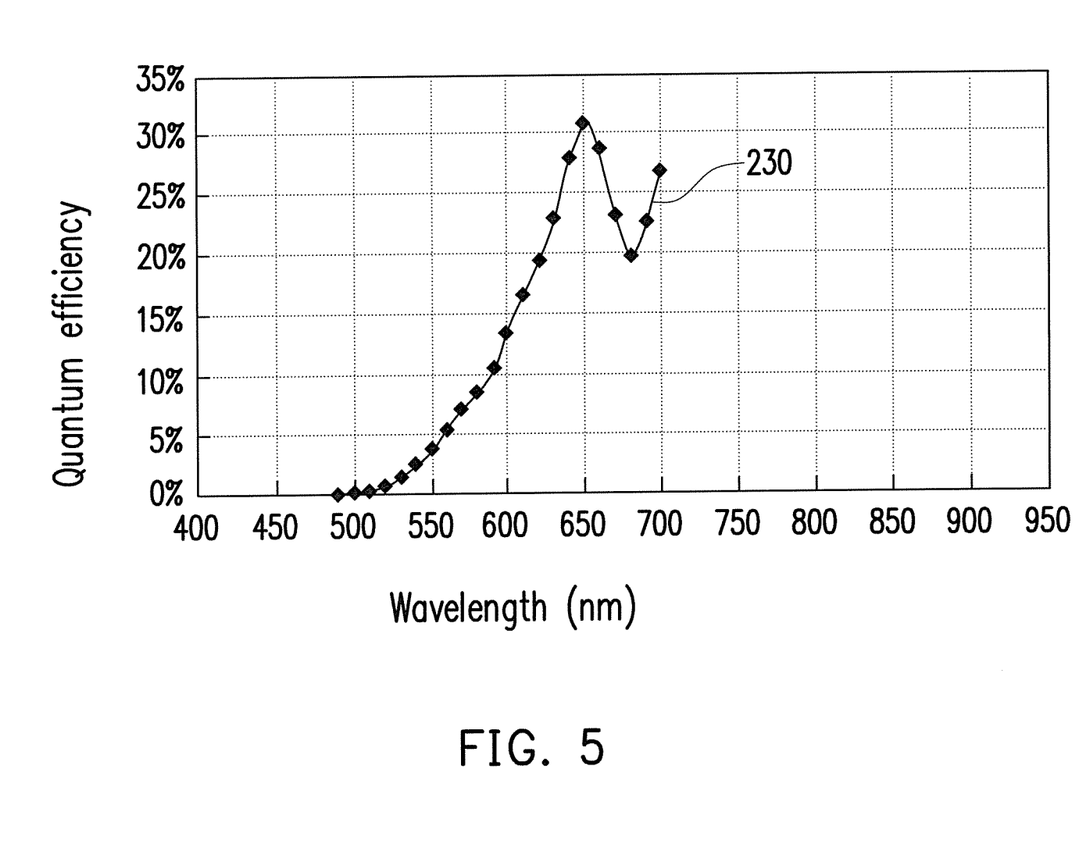

FIGS. 3-5 illustrate three quantum efficiency (QE) spectra sensed by a light sensor of three different wave bands.

The QE spectrum of light of the first wave band (such as blue light) sensed by the first wave band light sensors 46 is as shown by curve 210 of FIG. 3. The QE spectrum of light of the second wave band (such as green light) sensed by the second wave band light sensors 56 is as shown by curve 220 of FIG. 4. The QE spectrum of light of the third wave band (such as red light) sensed by the third wave band light sensors 14 is as shown by curve 230 of FIG. 5.

Based on the above, the sidewalls of each of the pixels of the invention are covered by spacers, and the lower electrodes of adjacent pixels can be isolated to prevent the issue of leakage. Moreover, the area of each of the lower electrodes can be made larger such that electric field is uniform to prevent the occurrence of a lag phenomenon. Moreover, a metal interconnect is disposed in the opening of any two adjacent pixels, and therefore light does not readily enter regions outside of the pixels. As a result, crosstalk can be avoided. Moreover, the invention can integrate a plurality of multi-wave band light sensors on the same chip to reduce layout area. The multi-wave band light sensors can sense light of different wave bands such as blue light, green light, and red light, and the light sensors for respectively sensing red light, green light, and blue light are disposed on the substrate from bottom to top. Moreover, in the invention, hydrogenated amorphous silicon is used as the multi-wave band light sensing structure. The multi-wave band light sensing structure has a relatively high QE in the visible light band and is highly suitable for the needs of multi-wave band light sensors for sensing wave bands. Moreover, the multi-wave band light sensors of the embodiments of the invention can be integrated in a semiconductor process.

Although the invention has been described with reference to the above embodiments, it will be apparent to one of the ordinary skill in the art that modifications and variations to the described embodiments may be made without departing from the spirit and scope of the invention. Accordingly, the scope of the invention will be defined by the attached claims not by the above detailed descriptions.

What is claimed is:

1. A light sensor, comprising:
   a substrate;
   a dielectric layer located on the substrate;
   a plurality of pixels located in the dielectric layer, wherein an opening is located between any two adjacent pixels;
   a plurality of spacers, each of the spacers being located on a sidewall of the opening between the corresponding pixels; wherein the spacers are conformal to the vertical side surfaces and bottom surface of the opening and
   a plurality of first metal interconnects, each of the first metal interconnects being completely filling the corresponding opening and covering the corresponding spacers so as to be electrically connected to the corresponding pixel.

2. The light sensor of claim 1, wherein each of the plurality of pixels comprises:
   a lower electrode;
   a hydrogenated amorphous silicon layer covering the lower electrode; and
   a transparent upper electrode covering the hydrogenated amorphous silicon layer.

3. The light sensor of claim 2, wherein the first metal interconnects are respectively electrically connected to the transparent upper electrodes of the corresponding pixels.

4. The light sensor of claim 2, wherein the hydrogenated amorphous silicon layers of the pixels respectively cover surfaces of the lower electrodes and are respectively extended to cover sidewalls of the lower electrodes.

5. The light sensor of claim 2, further comprising a plurality of cap layers respectively covering the transparent upper electrodes of the pixels.

6. The light sensor of claim 5, wherein each of the first metal interconnects comprises:
   a metal layer located between the spacers in the corresponding opening and extending to a portion of the corresponding cap layer of the corresponding pixel; and
   a via passing through the corresponding cap layer and electrically connected to the corresponding metal layer and the corresponding transparent upper electrode.

7. The light sensor of claim 6, wherein each of the spacers is further extended to cover a bottom of the corresponding opening and is located below the metal layer of the corresponding first metal interconnect.

8. The light sensor of claim 1, further comprising a color filter located on the dielectric layer.

9. The light sensor of claim 1, further comprising a plurality of second metal interconnects respectively electrically connected to a lower electrodes of the pixels and source regions of transistors on the substrate.

10. The light sensor of claim 1, wherein each of the pixels comprise a blue pixel, a green pixel, or a red pixel.

11. A multi-wave band light sensor, comprising:
    a substrate;
    a dielectric layer located on the substrate;
    a plurality of first wave band light sensors located on the dielectric layer, wherein a first opening is located between any two adjacent first wave band light sensors;
    a plurality of first spacers respectively located on sidewalls of the first openings; wherein the first spacers are conformal to the vertical side surfaces and bottom surface of the first openings
    a plurality of first metal interconnects respectively filling the first openings and respectively electrically connected to the first wave band light sensors;
    a plurality of second wave band light sensors located in the dielectric layer, wherein a second opening is located between any two adjacent second wave band light sensors, and each of the first wave band light sensors and each of the second wave band light sensors comprise:
      a lower electrode;
      a hydrogenated amorphous silicon layer covering the corresponding lower electrode; and
      a transparent upper electrode covering the corresponding hydrogenated amorphous silicon layer;
    a plurality of second spacers respectively located on sidewalls of the second openings;
    a plurality of second metal interconnects respectively filling the second openings and respectively electrically connected to the second wave band light sensors;
    a plurality of third wave band light sensors located in the substrate, wherein at least a portion of each of the second wave band light sensors is located between the corresponding third wave band light sensors and the corresponding first wave band light sensors and is overlapped with the corresponding third wave band light sensors and the corresponding first wave band light sensors, and wherein a portion of each of the first wave band light sensor not overlapped with the corresponding second wave band light sensors is electrically connected to a first metal layer, and another portion of each of the second wave band light sensor not overlapped with the corresponding third wave band light sensors is electrically connected to a second metal layer; and
    a protective layer located on the first wave band light sensors.

12. The multi-wave band light sensor of claim 11, wherein each of the first metal interconnects is electrically connected to the corresponding transparent upper electrode of the corresponding first wave band light sensors and each of the second metal interconnects is electrically connected to the corresponding transparent upper electrode of the corresponding second wave band light sensors.

13. The multi-wave band light sensor of claim 11, wherein each of the hydrogenated amorphous silicon layers of the first wave band light sensors and the second wave band light sensors covers a surface of the corresponding lower electrode and is extended to cover a sidewall of the corresponding lower electrode.

14. The multi-wave band light sensor of claim 11, further comprising a plurality of cap layers respectively covering the transparent upper electrodes of the first wave band light sensors and the second wave band light sensors.

15. The multi-wave band light sensor of claim 14, wherein each of the first metal interconnects comprises:
    a metal layer located between the corresponding first spacers in the corresponding first opening and extending to a portion of the corresponding cap layer on the corresponding first wave band light sensor; and a via passing through the corresponding cap layer and electrically connecting the corresponding metal layer and the corresponding transparent upper electrode.

16. The multi-wave band light sensor of claim 14, wherein each of the second metal interconnects respectively comprises:
    a metal layer located between the corresponding second spacers in the corresponding second opening and extending to a portion of the corresponding cap layer on the corresponding second wave band light sensor; and
    a via passing through the corresponding cap layer and electrically connecting the corresponding metal layer and the corresponding transparent upper electrode.

17. The multi-wave band light sensor of claim 11, further comprising:
    the lower electrode in the portion of each of the first wave band light sensor not overlapped with the corresponding second wave band light sensors is electrically connected the first metal layer through a first via; and
    the lower electrode in the portion of each of the second wave band light sensor not overlapped with the corresponding third wave band light sensors is electrically connected to the second metal layer through a second via.

18. The multi-wave band light sensor of claim 11, wherein each of the first wave band light sensors is a blue light sensor, each of the second wave band light sensors is a green light sensor, and each of the third wave band light sensors is a red light sensor.

19. The multi-wave band light sensor of claim 11, further comprising an infrared filter located on the protective layer and covering the first wave band light sensors.

20. The multi-wave band light sensor of claim 11, wherein each of the third wave band light sensors is a junction diode and comprises a well region formed in the substrate, wherein the substrate and the well region have different conductivity types.

\* \* \* \* \*